(12) United States Patent
Fedder et al.

(10) Patent No.: US 6,458,615 B1
(45) Date of Patent: Oct. 1, 2002

(54) METHOD OF FABRICATING MICROMACHINED STRUCTURES AND DEVICES FORMED THEREFROM

(75) Inventors: Gary K. Fedder, Turtle Creek; Xu Zhu, Pittsburgh, both of PA (US)

(73) Assignee: Carnegie Mellon University, Pittsburgh, PA (US)

( * ) Notice: Subject to any disclaimer, the term of this patent is extended or adjusted under 35 U.S.C. 154(b) by 0 days.

(21) Appl. No.: 09/409,570

(22) Filed: Sep. 30, 1999

(51) Int. Cl.[7] ............................................. H01L 21/00
(52) U.S. Cl. ...................... 438/50; 438/411; 438/696; 438/700; 438/707; 216/79
(58) Field of Search ................ 438/48, 50, 53, 438/411, 689, 696, 700–701, 706–707, 710, 712–713, 694; 257/414–417; 216/2, 11, 17, 58, 79

(56) References Cited

U.S. PATENT DOCUMENTS

| | | |
|---|---|---|
| 5,198,390 A | 3/1993 | MacDonald et al. |
| 5,393,375 A | 2/1995 | MacDonald et al. |
| 5,501,893 A | 3/1996 | Laermer et al. |
| 5,563,343 A | 10/1996 | Shaw et al. |
| 5,574,222 A | 11/1996 | Offenberg |
| 5,618,989 A | 4/1997 | Marek |
| 5,659,195 A | 8/1997 | Kaiser et al. |
| 5,717,631 A | 2/1998 | Carley et al. |
| 5,880,369 A | 3/1999 | Samuels et al. |
| 6,032,527 A * | 3/2000 | Genova et al. ............ 73/204.26 |
| 6,088,907 A * | 7/2000 | Lee et al. ................. 29/603.03 |
| 6,239,473 B1 * | 5/2001 | Adams et al. ............... 257/419 |

OTHER PUBLICATIONS

Fedder et al, "Laminated High–Aspect–Ratio Microstructures in a Conventional CMOS Process", 1996, IEEE, 0–7803–2985–6/96, pp. 13–18.*

* cited by examiner

Primary Examiner—Carl Whitehead, Jr.
Assistant Examiner—Jamie L. Brophy
(74) Attorney, Agent, or Firm—Kirkpatrick & Lockhart LLP

(57) ABSTRACT

A method for fabricating a micromachined structure. The method includes forming a circuitry layer having an upper etch-resistant layer on an upper surface of a substrate, directionally etching a portion of the circuitry layer exposed by the upper etch-resistant layer, and directionally etching a portion the substrate exposed by the upper etch-resistant layer with a deep reactive ion etch.

17 Claims, 13 Drawing Sheets

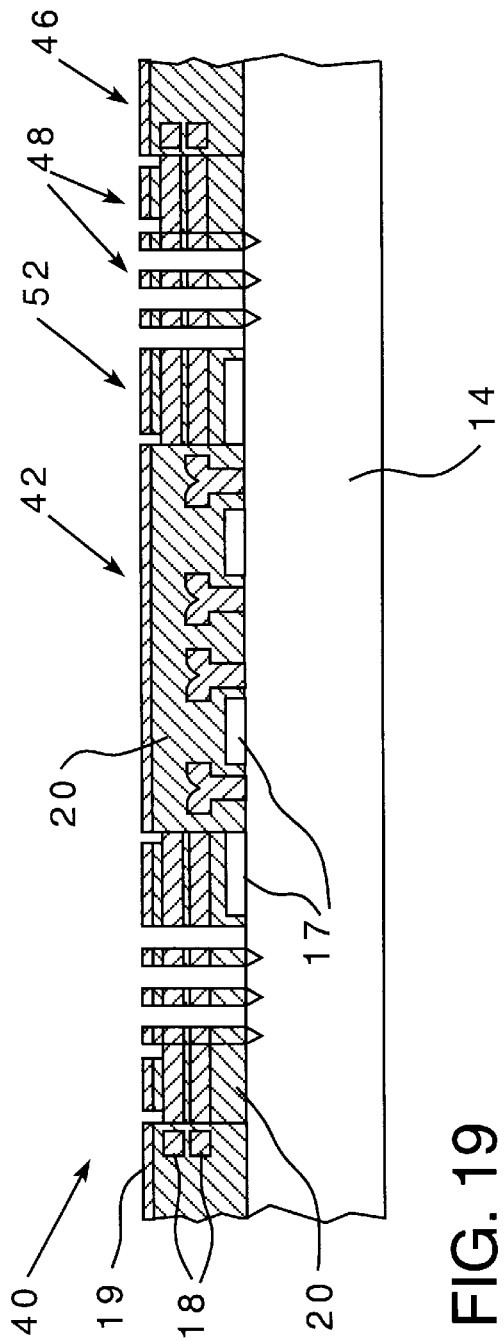
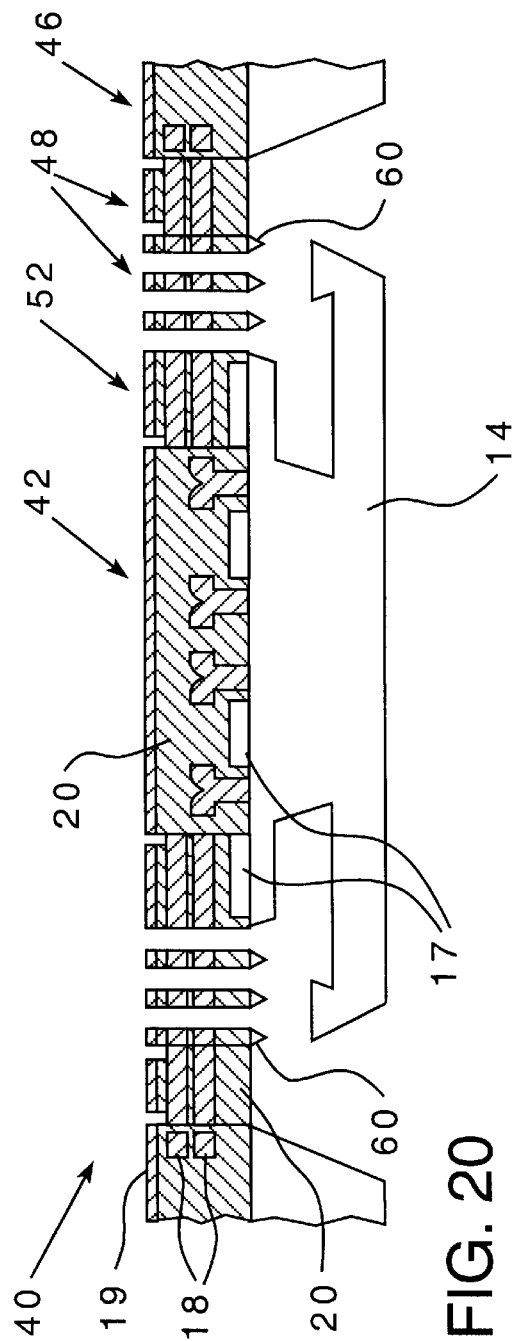
FIG. 19
FIG. 20

METHOD OF FABRICATING MICROMACHINED STRUCTURES AND DEVICES FORMED THEREFROM

STATEMENT REGARDING FEDERALLY SPONSORED RESEARCH AND DEVELOPMENT

Certain of the research leading to the present invention was sponsored by the United States Defense Advanced Research Projects Agency—Electronic Technologies Office (DARPA-ETO) under contract No. F30602-97-2-0323. The United States Government may have rights in the invention.

CROSS-REFERENCE TO RELATED APPLICATIONS

Not Applicable.

BACKGROUND OF THE INVENTION

1. Field of Invention

The present invention is directed generally to methods for fabricating micromachined structures and, more particularly, to methods for fabricating micromachined structures combining bulk substrate etching with micromachining.

2. Description of Background

Microfabrication, also known as micromachining, commonly refers to the use of known semiconductor processing techniques to fabricate devices known as microelectromechanical systems (MEMS) or micromachined devices. In general, known MEMS fabrication processes involve the sequential addition and removal of layers of material from a substrate layer through the use of film deposition and etching techniques until the desired structure has been realized. Accordingly, MEMS devices typically function under the same principles as their macroscale counterparts. MEMS devices, however, offer advantages in design, performance, and cost in comparison to their macroscale counterparts due to the decrease in scale of MEMS devices. In addition, due to batch fabrication techniques applicable to MEMS technology, significant reductions in per unit cost may be realized.

Micromachined structures are frequently used in MEMS inertial sensors, such as accelerometers and gyroscopes. A MEMS accelerometer using differential capacitors to detect acceleration typically includes three primary micromachined elements: a central, or proof, member, capacitor plates, and support springs. FIG. 21 is a top plan view of a typical prior differential capacitor-based micromachined accelerometer 100, including movable central member 102 supported by spring support beams 104. The central member 102 includes a number of fingers 108 extending perpendicularly away from the central member 102, which are interleaved with a number of fingers 110 extending perpendicularly from support beams 112. These features are formed in a cavity 116 formed in a substrate 118 through conventional etching techniques, and may be anchored to the underlying substrate 118 or cantilevered structures released from the substrate 118. The fingers 108 and 110 are typically oxide structures covered with a coating of conductive material, such as aluminum, thereby creating individual parallel-plate capacitors between each adjacent pair of the interleaved fingers 108, 110. In operation, when the accelerometer 100 is accelerated, the fingers 108 move relative to the fingers 110, thereby varying the distance, and hence the capacitance, between the fingers 108, 110. The variable capacitance can be determined by peripheral circuitry interfacing with connectors 120, which are connected to the fingers 110 via the support beams 112.

The sensitivity of such prior micromachined accelerometers 100 is dependent upon a number of factors, including the mass of the central, or proof, member 102. Generally, the greater the mass of the central member 102, the better the inertial sensing device because for a given acceleration, there will be a greater force. Thus, additional mass could be added by enlarging the central member 102, thus increasing the tendency of the central member 102 to remain motionless relative to the other components of the accelerometer 100. However, because typical prior microaccelerometers require peripheral circuitry, there is a practical limit to the available size of the central member 102 given a particular die size. Moreover, because the circuitry is peripheral, a relatively large amount of parasitic capacitance is introduced into the electrical system of the accelerometer 100, thereby degrading device sensitivity.

It is known, however, to use CMOS-micromachining processes to create microstructures that are made out of the dielectric and metallization layers in a CMOS process. According to such processes, one of the CMOS interconnect metal layers, or some other layer made from an etch-resistant mask material, acts as an etch-resistant mask for defining the microstructural sidewalls. A reactive-ion etch of the CMOS oxide layer creates composite metal/dielectric microstructures that can have a high aspect ratio of beam width to beam thickness, and of gaps between the beams to beam thickness.

There are two primary techniques to refine and release CMOS micromachined structures: wet etching and dry plasma etching. Wet etching provides the disadvantage that it generally cannot reproduce complex shaped structures with accurate dimensional control. Dry plasma etching, on the other hand, typically is free from dimensional restrictions. However, the current semiconductor-based plasma systems used for dry plasma etching have very slow etch rates, for example, below one $\mu$m/min for silicon. This disadvantage is particularly acute when the CMOS microstructure is to be combined with, for example, a bulk silicon substrate, which may have a thickness between 400–500 $\mu$m. In addition, the plasma systems have limited selectivities to mask materials, for example, 20–30:1 for a silicon dioxide ($SiO_2$) mask over silicon (Si).

A known prior solution for fabricating submicron movable mechanical structures uses a chemically assisted ion beam etch (CAIBE) and a reactive ion etch (RIE). According to the process, a RIE is performed to selectively remove portions of dielectric layers formed on a substrate, such as a GaAs substrate. Next, a CAIBE is performed to selectively remove portions of the GaAs substrate to define the trenches of the structure. Subsequently, a nitride layer is deposited over the structure, including the trenches, by plasma-enhanced chemical vapor deposition (PECVD) to protect the mesa structure. After the nitride layer is formed, the portions of the nitride layer are etched back to remove the nitride layer from the bottoms of the trenches, but to retain the nitride layer on the sidewalls of the mesa structure. Next, a RIE process can be used to undercut the substrate material under the structure. This solution thus requires the deposition of materials to protect the microstructure during the etching of the substrate layer, which therefore increases production steps and consequently production costs.

Accordingly, there exists a need for a method of fabricating micromachined structures with bulk substrates according to less expensive and time-consuming fabrication processes. There also exists a need for a fabrication method requiring fewer fabrication steps.

BRIEF SUMMARY OF THE INVENTION

The present invention is directed to a method for fabricating a micromachined structure. The method includes forming a circuitry layer having an upper etch-resistant layer on an upper surface of a substrate, directionally etching a portion of the circuitry layer exposed by the upper etch-resistant layer, and directionally etching a portion the substrate exposed by the upper etch-resistant layer with a deep reactive ion etch.

The present invention represents an advancement over prior methods of fabricating microelectromechanical structures in that it eliminates fabrication steps, such as deposition steps, thus realizing a reduction in fabrication time and cost. The present invention further has the advantage that it adopts existing process equipment and recipes, without having to place strict process requirements for the fabricated MEMS devices, especially etching of the substrate wafer. The present invention has the further advantage of enabling the manufacture of inexpensive, very-high performance MEMS inertial sensors and microfluidic devices. The present invention also represents an advantage in that it permits the fabrication of microstructures on micromachined bulk silicon which can include circuitry on a moving structure, thereby reducing the die area and lowering fabrication costs. The present invention has the further advantage that it permits that fabrication of micromachined devices from entirely single-sided etching without the need to use extra masks. These and other benefits of the present invention will be apparent from the detailed description of the invention hereinbelow.

BRIEF DESCRIPTION OF THE SEVERAL VIEWS OF THE DRAWING

For the present invention to be clearly understood and readily practiced, the present invention will be described in conjunction with the following figures, wherein like reference numerals are used to designate like elements and wherein:

FIG. 19 is a cross-sectional side-view of the microelectromechanical device of FIG. 15 along the A–A' line after etching of the micromachined structure layer;

FIG. 20 is cross-sectional side-view of the microelectromechanical device of FIG. 15 along the A–A' line after a tapered etch of the substrate.

DETAILED DESCRIPTION OF THE INVENTION

It is to be understood that the figures and descriptions of the present invention have been simplified to illustrate elements that are relevant for a clear understanding of the present invention, while eliminating, for purposes of clarity, other elements found in micromachined structures and devices. Those of ordinary skill in the art will recognize that other elements may be desirable. However, because such elements are well known in the art, and because they do not facilitate a better understanding of the present invention, a discussion of such elements is not provided herein.

Figure 1:
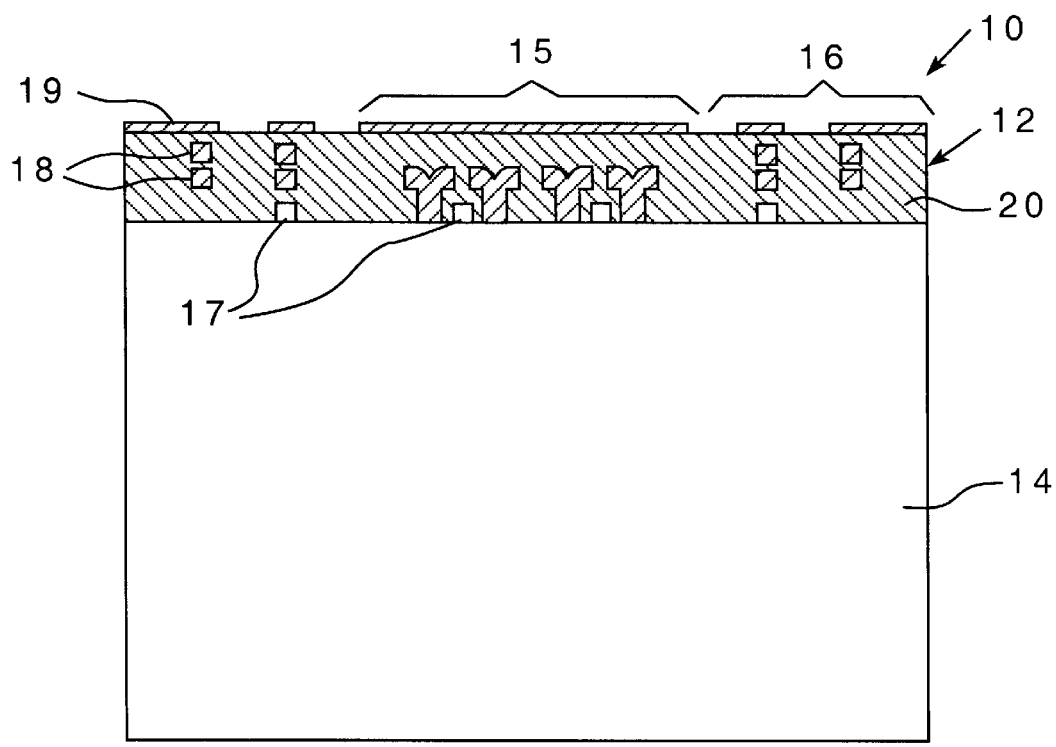
FIG. 1 is a cross-sectional side-view of a substrate assembly according to the present invention.

FIG. 1 illustrates a cross-sectional view of a substrate assembly 10 having a circuitry layer 12 formed on a substrate 14. The substrate 14 is the lowest layer of material on a wafer, such as, for example, a single crystal silicon wafer. The substrate assembly 10 includes the circuitry layer 12, the substrate 14, and any additional or intervening layers or structures formed thereon. The circuitry layer 12 may be, for example, a CMOS circuitry layer, including CMOS circuitry regions 15 and CMOS interconnect regions 16, formed on the substrate 14 according to conventional CMOS fabrication techniques. For an embodiment in which the circuitry layer 12 is a CMOS circuitry layer, as illustrated in FIG. 1, the CMOS circuitry layer 12 may include polysilicon layers 17 and metal layers 18, including an upper metal layer 19. The CMOS circuitry layer 12 may also include dielectric layers 20. The dielectric layers 20 may be, for example, an oxide layer such as, for example, silicon dioxide. The thickness of the CMOS circuitry layer 12 may be, for example, 5–7 μm. The substrate 14 may be, for example, a bulk silicon mass and may have a thickness of, for example, 400–500 μm.

Figure 2:
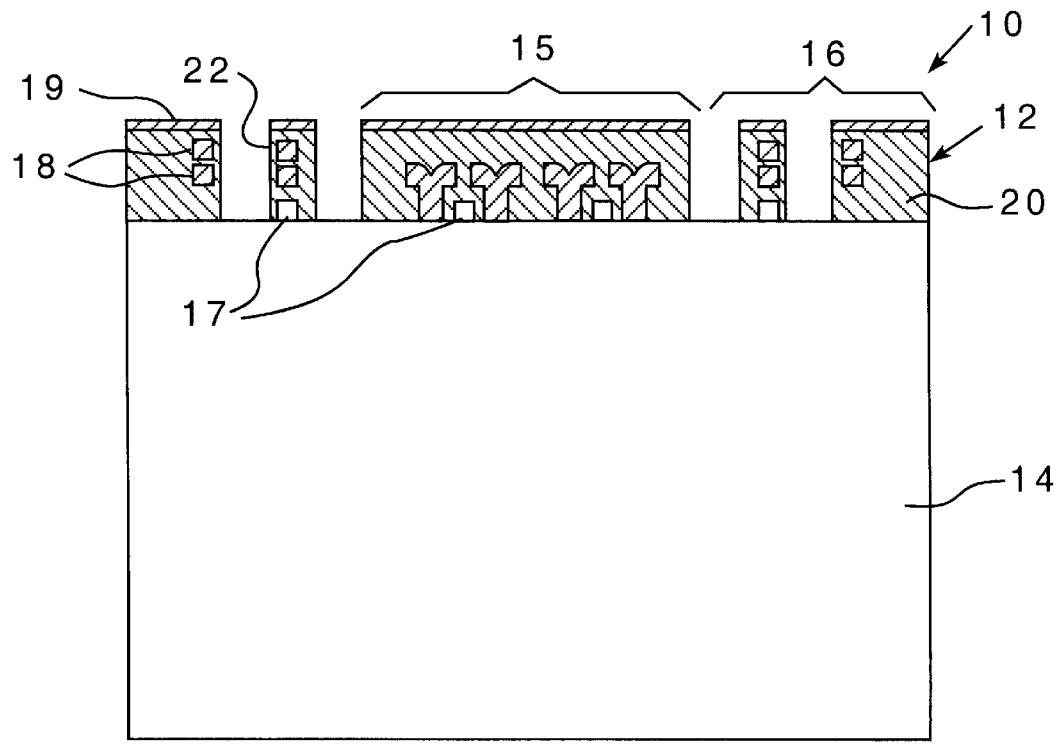
FIG. 2 is a cross-sectional side-view of the substrate assembly of FIG. 1 after portions of a circuitry layer have been removed.

FIG. 2 illustrates the substrate assembly 10 after micromachining of the circuitry layer 12. In the illustrated embodiment, portions of the dielectric layers 20 of the CMOS circuitry layer 12 have been removed by a reactive ion etch (RIE). The upper metal layer 19 acts as the etching mask such that only those portions of the dielectric layers 20 exposed by the upper metal layer 19 are removed. RIE's are directional (anisotropic), such that a number microstructures 22 having well-defined sidewalls are formed. As in the illustrated embodiment, the microstructures 22 may include cantilevered CMOS dielectric/metallization layers. The RIE may be performed with, for example, $CHF_3$ as the etchant gas in an $O_2$ plasma. CMOS micromachining processes used to create CMOS microstructures are further described in U.S. Pat. No. 5,717,631 entitled "Microelectromechanical Structure and Process of Making Same" to Carley et al., and allowed U.S. patent application Ser. No. 08/943,663, filed Oct. 3, 1997, entitled "Microelectromechanical Structure and Process of Making Same" to Carley et al., which are incorporated herein by reference.

Figure 3:
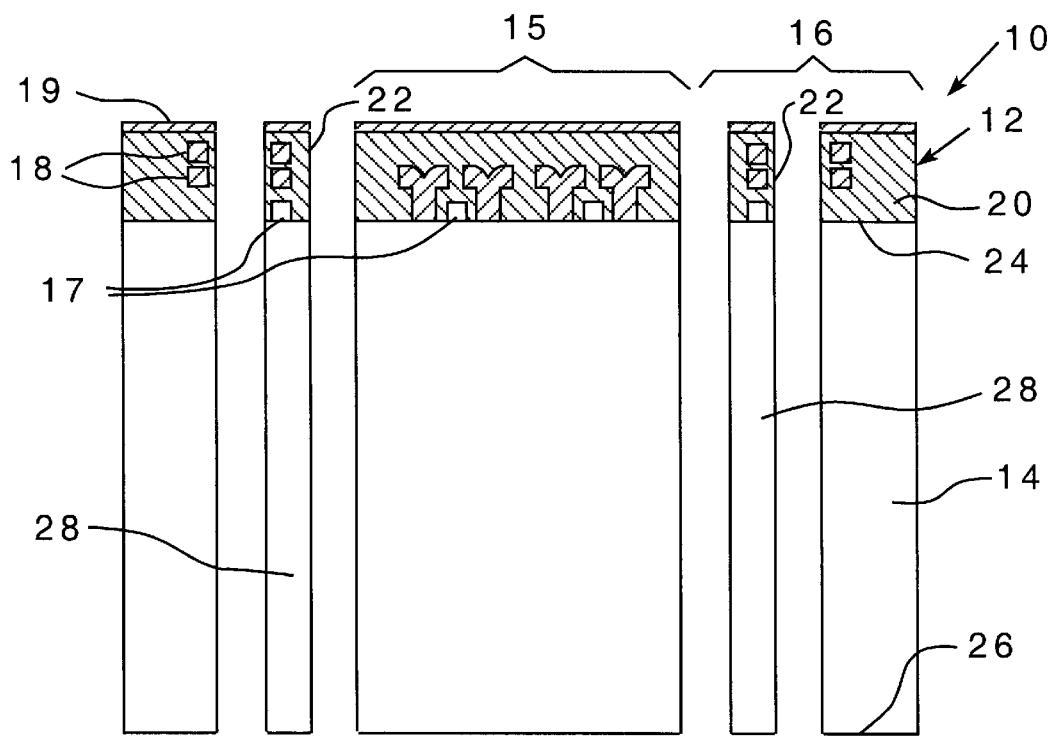
FIG. 3 is a cross-sectional side-view of the substrate assembly of FIG. 2 after portions of the substrate have been removed.

FIG. 3 illustrates the substrate assembly 10 according to one embodiment of the present invention after portions of the substrate 14 have been removed according to a directional deep reactive ion etch (DRIE). The DRIE may utilize an inductively coupled plasma (ICP) process, using an inductively coupled plasma chamber having an inductor coil exterior to the chamber wherein the etchant gases are inductively ionized to generate plasma by electrical current flowing through the inductor coil. By utilizing a DRIE, sufficiently high aspect ratio silicon structures with well defined sidewalls can be achieved through repeated etching and passivation steps.

According to one embodiment of the DRIE process, the exposed silicon of the substrate 14 is subjected to a first etching step with a mixture of, for example, sulfur hexafluoride ($SF_6$) and oxygen ($O_2$), having a gas flow of between, for example, 0 and 200 standard cubic centimeters per minute (sccm) and a processing pressure of, for example, 10 to 100 mTorr. The plasma generation may take place with, for example, a microwave irradiation at outputs between 300 and 1200 W. The substrate 14 may be prestressed with, for example, a voltage between 5 and 300V, which may be achieved by, for example, a high-frequency supply, such as 13.56 MHz, at outputs between, for example, 2 and 10 W. The first etching step may be performed, for example, until an etching depth of 2–3 μm is achieved.

Subsequently, a polymerization step may be performed. According to one embodiment, the polymerization step is performed with a mixture of, for example, perfluorocyclobutane ($C_4F_8$) and argon (Ar), with a gas flow between, for example, 0 and 100 sccm, and a process pressure between, for example, 10 and 100 mTorr. A plasma may be generated with a microwave irradiation between, for example, 300 and 1200 W. During the polymerization, the surfaces of the substrate exposed by the etching, i.e., the sidewalls and etching base, are covered with polymer. The polymerization step may last for so long that, for example, a 50 nm thick polymer layer is precipitated on the sidewalls and etching base.

The etching and polymerization steps may be repeated alternately until the desired etching depth is achieved. During the etching steps, the sidewalls of the structures to be etched remain protected by the polymer applied during the polymerization step. The polymer layer applied to the etching base, however, is rapidly broken down through during the subsequent etching step. Using an ICP as in the present invention generates a much higher plasma density than conventional RIE. Accordingly, high etch rates of, for example, between 2 and 10 μm/min may be achieved, as well as greater material selectivities.

For the embodiment illustrated in FIG. 3, the substrate 14 is etched completely through, i.e., from an upper surface 24 completely through to a lower surface 26 of the substrate 14. The microstructures 22 are anchored to and supported by tall, thin beam supports or springs 28 of substrate material. Bulk silicon microstructures such as, for example, beam springs 28, may be useful in forming high-performance miniature inertial sensors, such as accelerometers and gyroscopes, when combined with CMOS microstructures 22.

Figure 4:
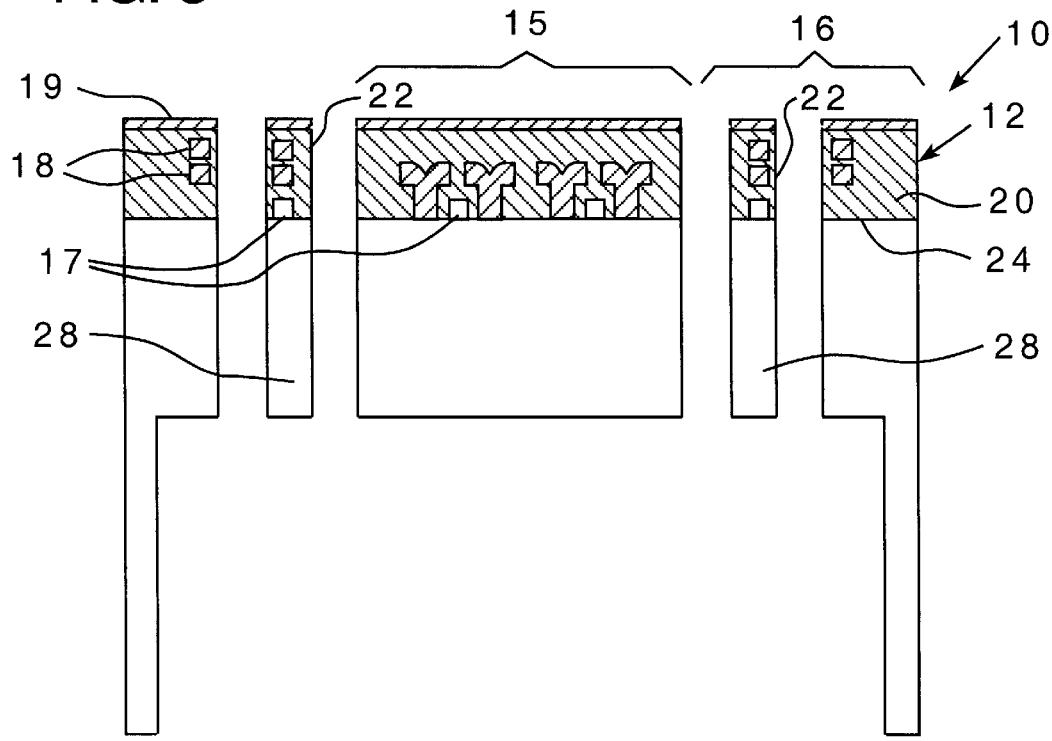
FIG. 4 is a cross-sectional side-view of the substrate assembly according to another embodiment of the present invention.

FIG. 4 illustrates the substrate assembly 10 according to another embodiment of the present invention, in which the directional DRIE extends partially into the substrate 14, i.e., to a midpoint in the substrate, whereupon a backside etch of the lower surface 26 of the substrate 14 is performed. The backside etch may be performed using conventional etching techniques.

Figure 5:
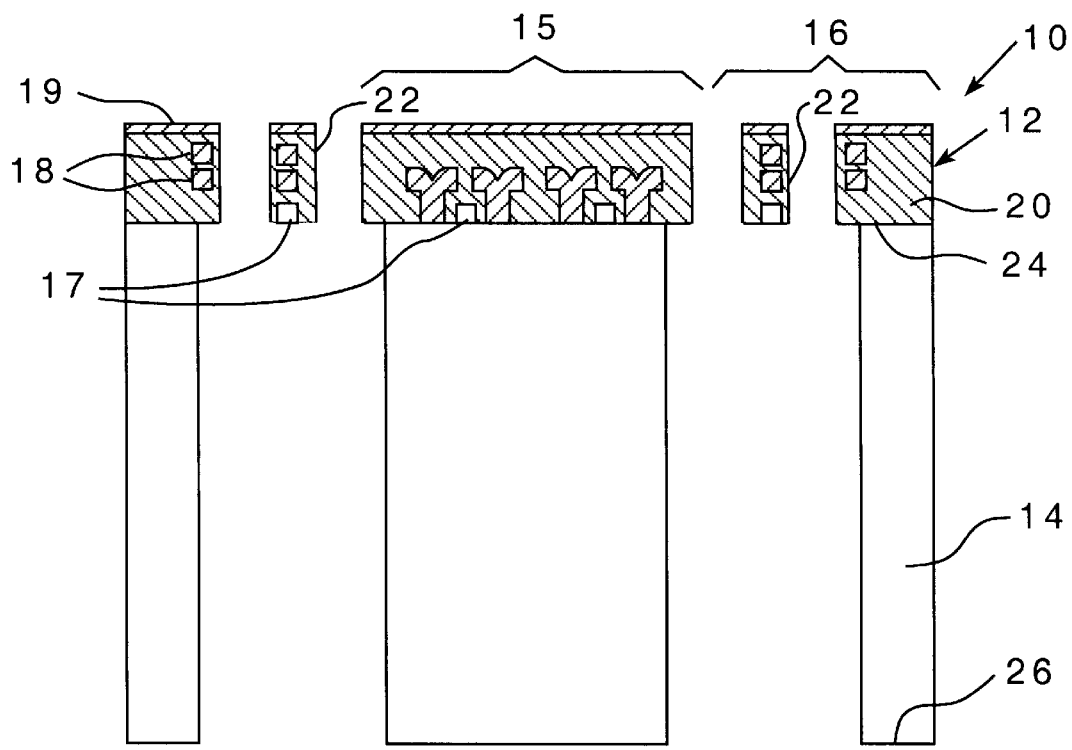
FIG. 5 is a cross-sectional side-view of the substrate assembly according to another embodiment of the present invention.

FIG. 5 illustrates the substrate assembly 10 according to another embodiment of the present invention. The embodiment illustrated in FIG. 5 is similar to the embodiment illustrated in FIG. 3, wherein the substrate 14 is etched completely through. For the embodiment illustrated in FIG. 5, however, the substrate 14 is subjected to a subsequent isotropic etching step, which removes the beam springs 28 to release the microstructures 22 from the substrate 14 such that the microstructures 22 are cantilevered. The isotropic etch may use, for example, sulfur hexafluoride ($SF_6$) or xenon difluoride ($XeF_2$) as the etchant gas. Because an isotropic etch is used to remove the beam springs 28, substrate material will also be removed from under the CMOS circuitry regions 15 and CMOS interconnect regions 16. In order to minimize the amount of substrate material removed from under the CMOS circuitry regions 15 and CMOS interconnect regions 16, according to one embodiment, the isotropic etch lasts for only so long as to remove the substrate material comprising the beam springs 28 to release the microstructures 22 from the substrate 14. Such an embodiment may be useful, for example, in fabricating structures moving out of the plane of the wafer.

Figure 6:
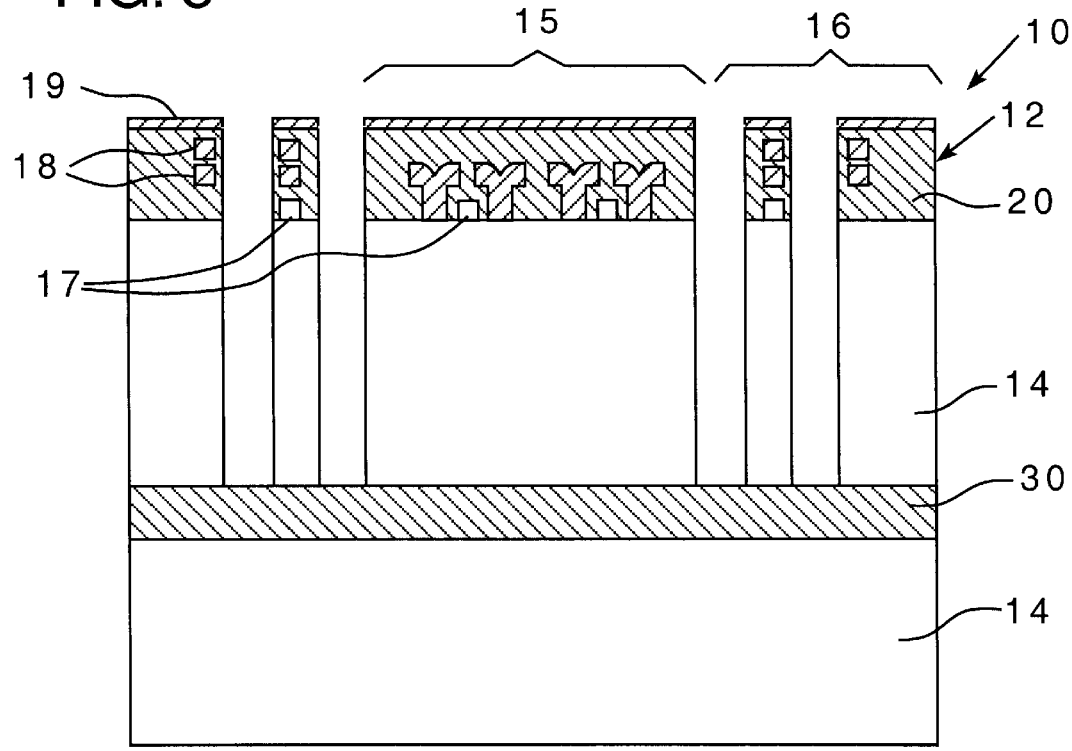
FIG. 6 is a cross-sectional side-view of the substrate assembly according to another embodiment of the present invention.
Figure 7:
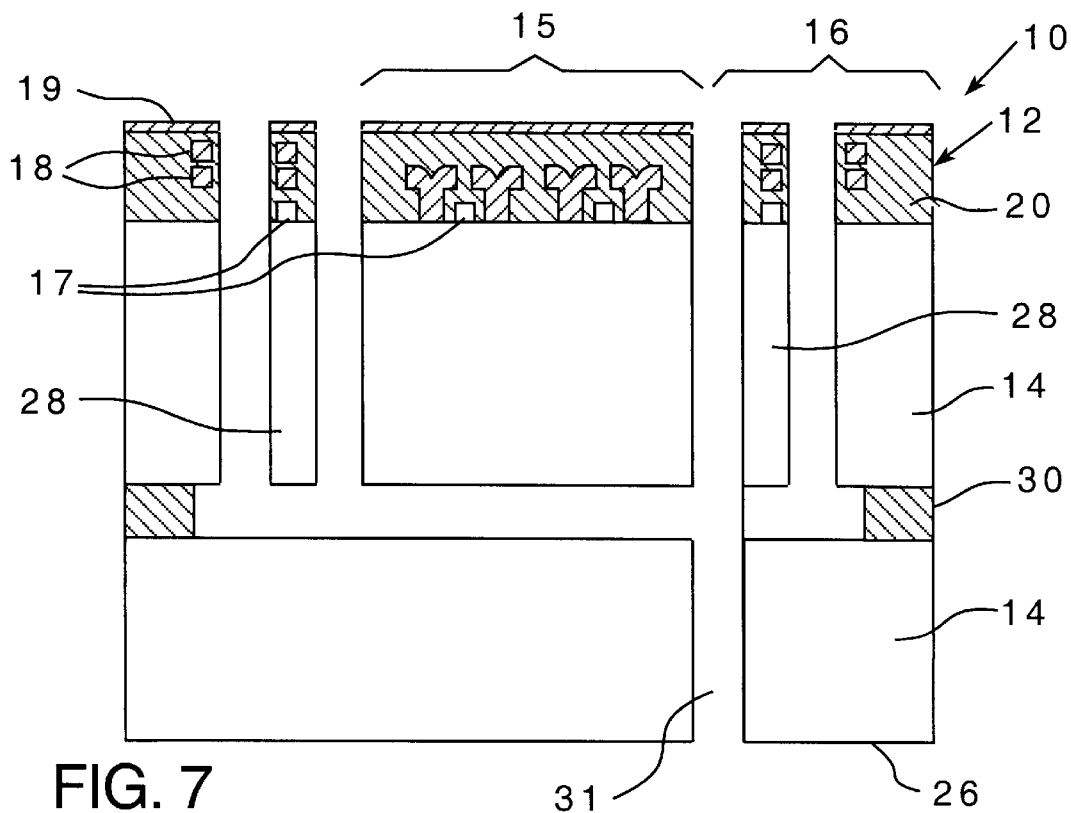
FIG. 7 is a cross-sectional side-view of the substrate assembly of FIG. 6 after a portion of an insulating layer has been removed.

According to another embodiment, the method of the present invention may also be used to fabricate micromachined structures on a silicon-on-insulator (SOI) substrate, as illustrated in FIGS. 6 and 7. FIG. 6 illustrates the substrate assembly 10 having the circuitry layer 12 formed on a SOI substrate including insulator layer 30, such as silicon dioxide, embedded in the substrate 14. As illustrated in FIG. 6, the substrate 14 is etched, such as by a directional ICP-DRIE, down to the insulator layer 30. As illustrated in FIG. 7, the insulating layer 30 is subjected to a subsequent undercut etch selective to the insulating material of the insulating layer 30 to remove a portion of the insulating layer 30. For an embodiment in which the dielectric layers 20 of the circuitry layer 12 are the same material as the insulating layer 30, to avoid etching of the dielectric layers 20, the insulating layer 30 may be accessed for the selective etch via at least one opening 31 in the lower surface 26 of the substrate 14.

Figure 8:
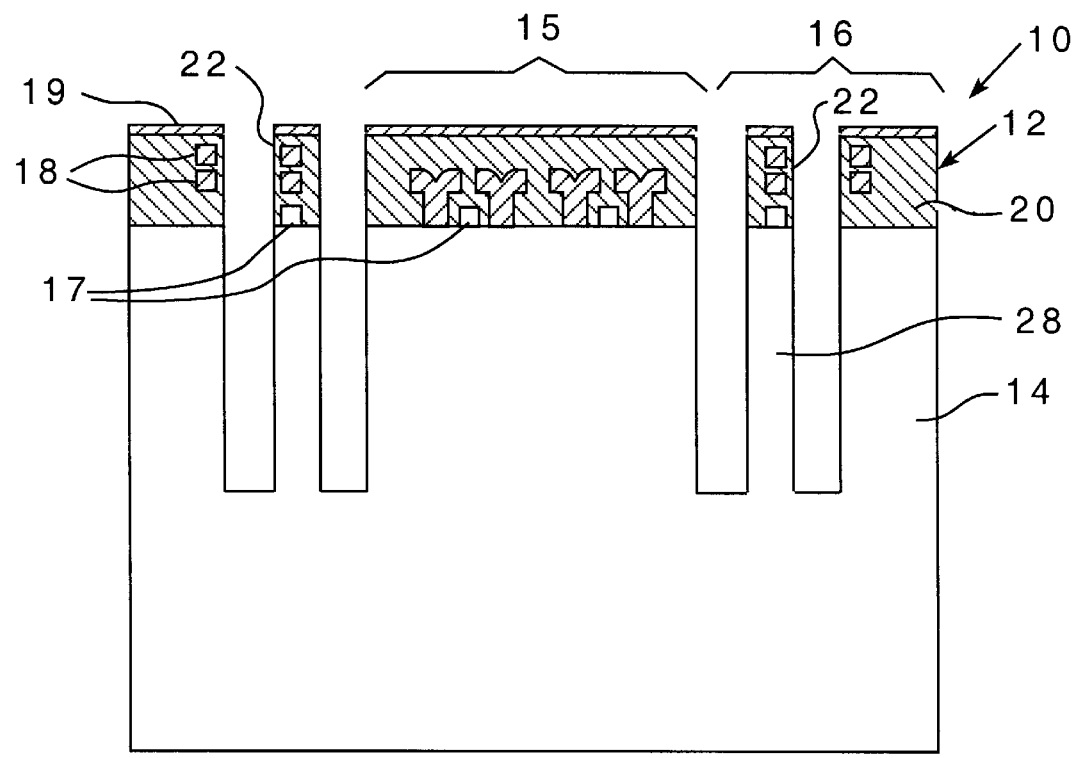
FIG. 8 is a cross-sectional side-view of the substrate assembly according to another embodiment of the present invention.
Figure 9:
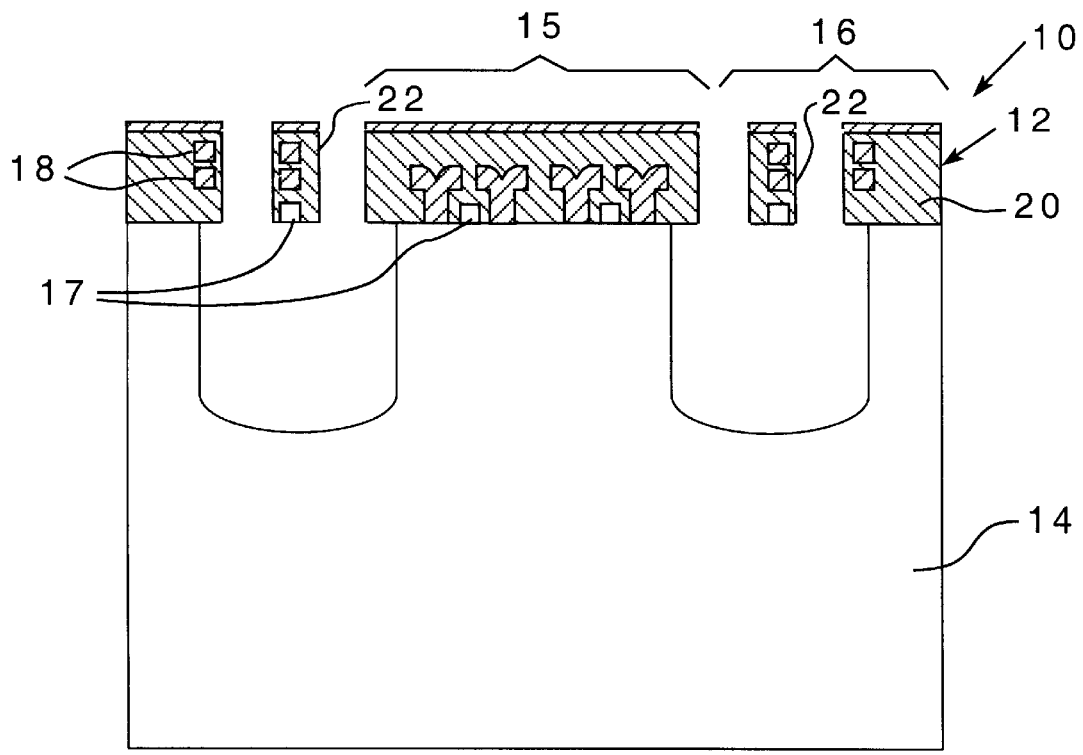
FIG. 9 is a cross-sectional side-view of the substrate assembly of FIG. 8 after a portion of the substrate has been removed.

FIGS. 8 and 9 illustrate the substrate assembly 10 according to another embodiment of the present invention. The method includes etching the circuitry layer 12 using, for example, a RIE, as described hereinbefore, using the upper metal layer 19 of the circuitry layer 12 as the etching mask. Subsequently, the portions of the substrate 14 exposed by the upper metal layer 19 are etched using a DRIE, as described hereinbefore, terminating at a midpoint of the substrate 14, as illustrated in FIG. 8, resulting in the beam springs 28. Subsequently, the substrate assembly 10 is subjected to an isotropic etch to remove the beam springs 28. Because the etch is isotropic, substrate material from under the CMOS circuitry regions 15 and CMOS interconnect regions 16 is removed. In order to minimize the amount of substrate material removed from under the circuitry layers 12, according to one embodiment, the isotropic etch may be timed such that it lasts for only as long as is necessary to remove the beam springs 28 and release the microstructure 22 from the substrate 14.

Figure 10:
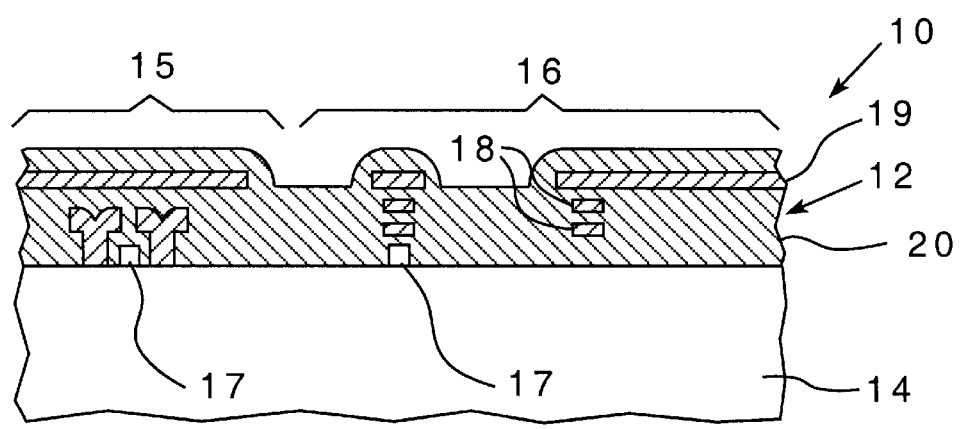
FIG. 10 is a cross-sectional side-view of the substrate assembly according to another embodiment of the present invention.
Figure 11:
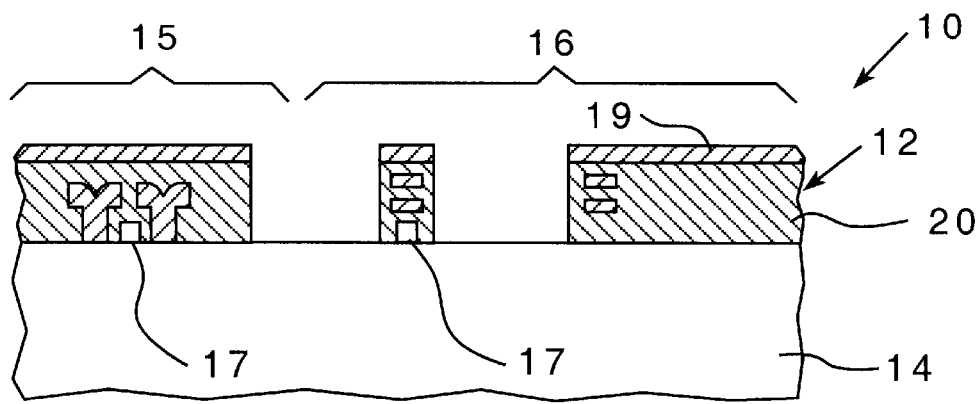
FIG. 11 is a cross-sectional side-view of the substrate assembly of FIG. 10 after portions of the circuitry layer have been removed.
Figure 12:
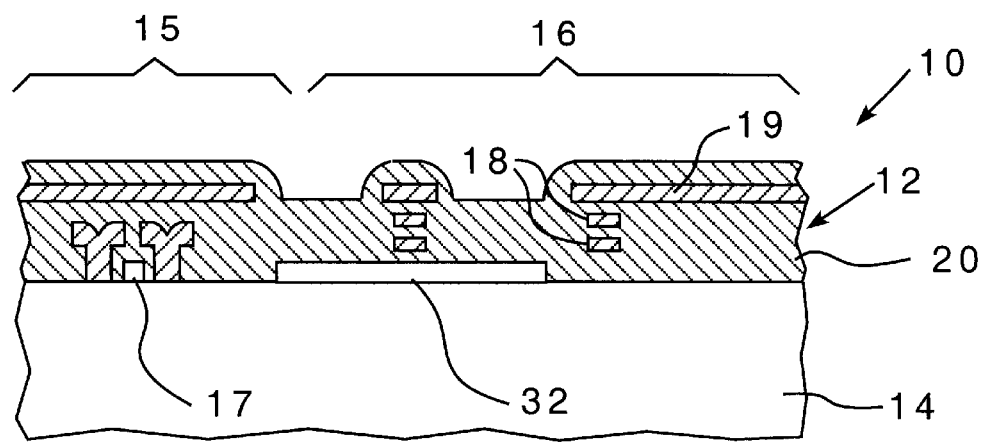
FIG. 12 is a cross-sectional side-view of the substrate assembly according to another embodiment of the present invention.
Figure 13:
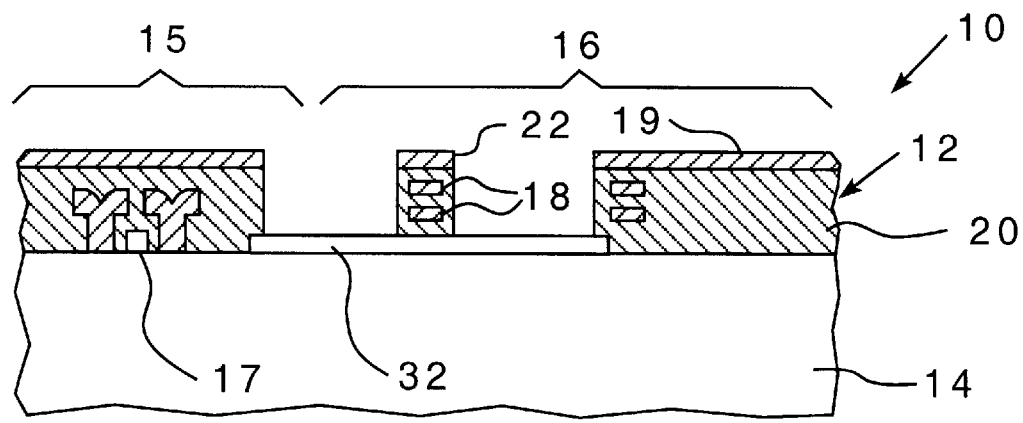
FIG. 13 is a cross-sectional side-view of the substrate assembly of FIG. 12 after portions of the circuitry layer have been removed.
Figure 14:
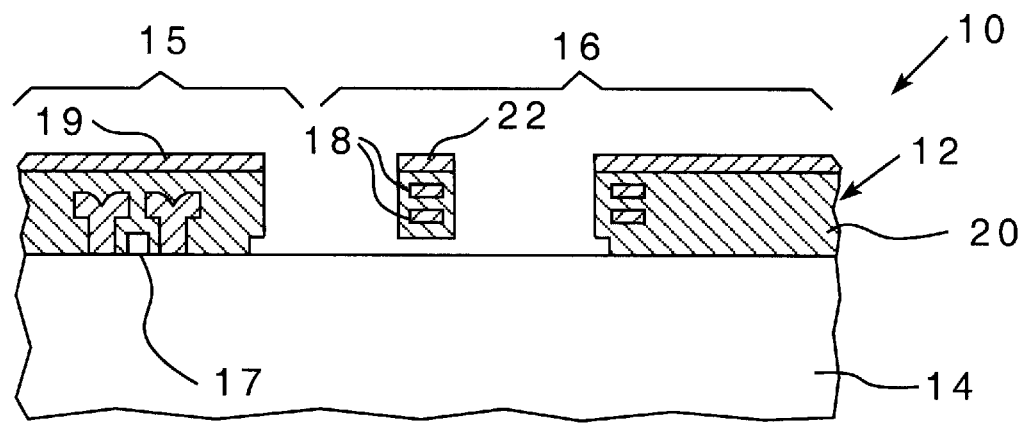
FIG. 14 is a cross-sectional side-view of the substrate assembly of FIG. 13 after additional portions of the circuitry layer have been removed.

FIGS. 10–14 illustrate the substrate assembly 10 according to another embodiment of the present invention. FIG. 10 illustrates the substrate assembly 10 having a circuitry layer 12 such as, for example, a CMOS circuitry layer including CMOS circuitry regions 15 and CMOS interconnect regions 16, fabricated on the substrate 14, such as a bulk silicon mass substrate. FIG. 11 illustrates the substrate assembly 10 after portions of the dielectric layers 20 of the circuitry layer 12 have been removed by a DRIE, as described hereinbefore. According to the illustrated embodiment, the upper metal layer 19 of the circuitry layer 12 acts as the mask for the DRIE such that the portions of the dielectric layers 20 exposed by the upper metal layer 19 are removed. FIG. 11 illustrates an embodiment in which the DRIE of the circuitry layer 12 terminates at the substrate 14. FIGS. 12–14 illustrate another embodiment of the present invention in which the DRIE of the circuitry layer 12 terminates at a polysilicon layer 32 in the circuitry layer 12. As illustrated in FIG. 14, the polysilicon layer 32 may be subsequently removed by, for example, a selective ICP etch, to release the microstructure 22. Utilizing a DRIE to etch the circuitry layer 12 as in the present invention provides extremely well-defined sidewalls in comparison to prior methods employing a RIE. The substrate assemblies 10 illustrated in FIGS. 10–14 may also be subjected to a DRIE, to etch the substrate 14, as described hereinbefore in conjunction with FIGS. 3–9.

Figure 15:
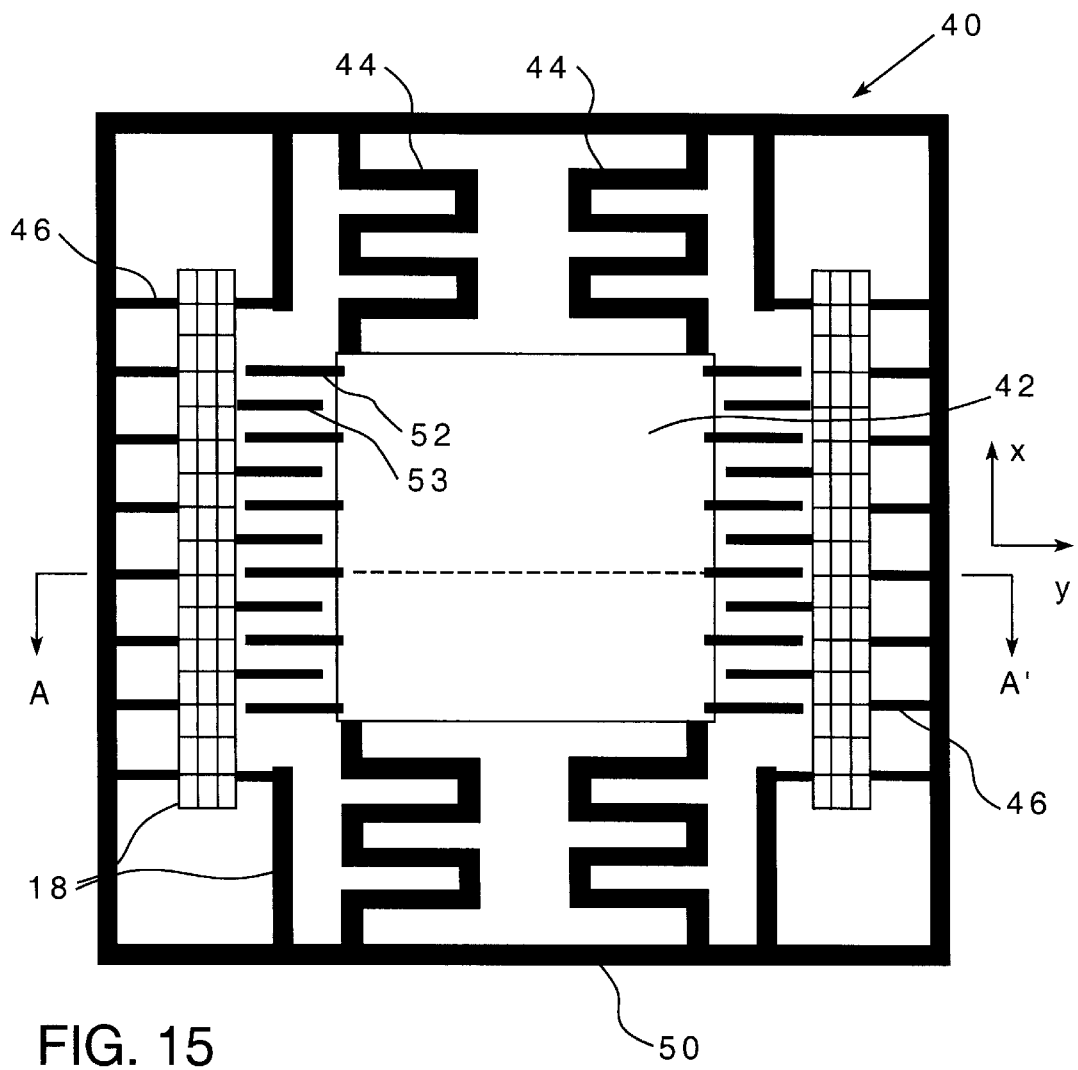
FIG. 15 is a top plan view of a microelectromechanical device according to an embodiment of the present invention.
Figure 16:
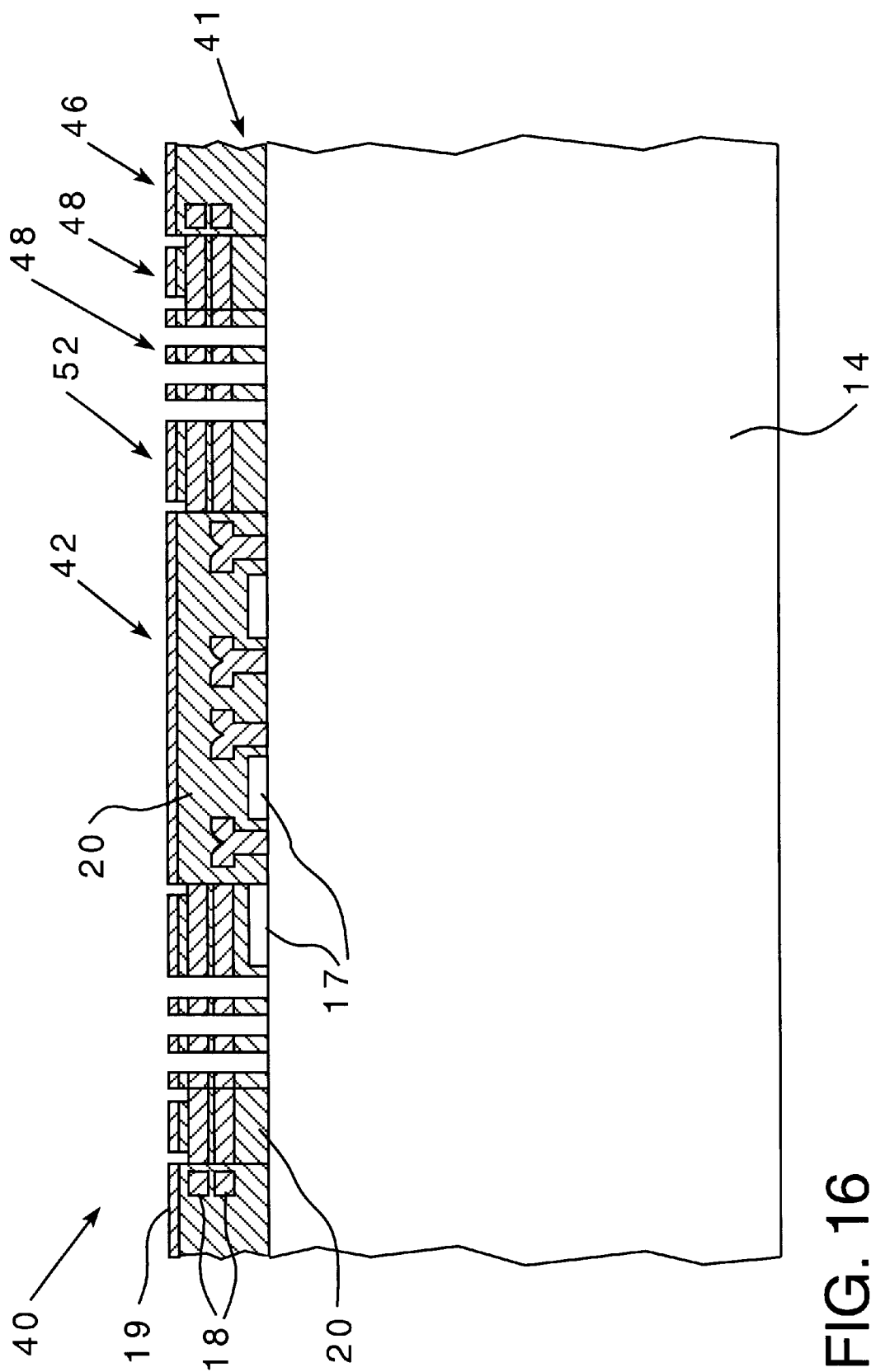
FIG. 16 is a cross-sectional side-view of the microelectromechanical device of FIG. 15 along the A–A' line after etching of the micromachined structure layer.
Figure 17:
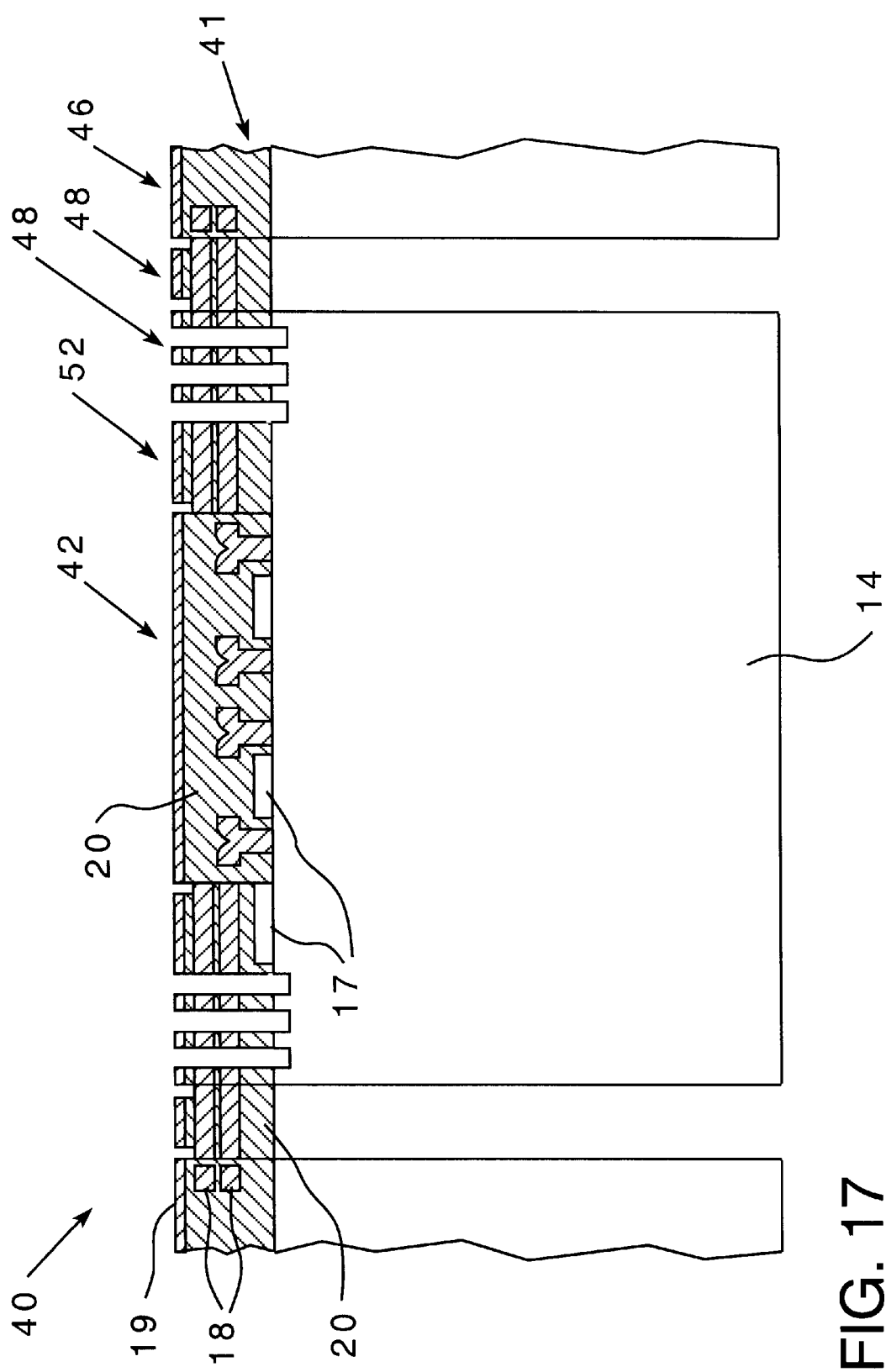
FIG. 17 is a cross-sectional side-view of the microelectromechanical device of FIG. 15 along the A–A' line after directionally etching the substrate.
Figure 18:
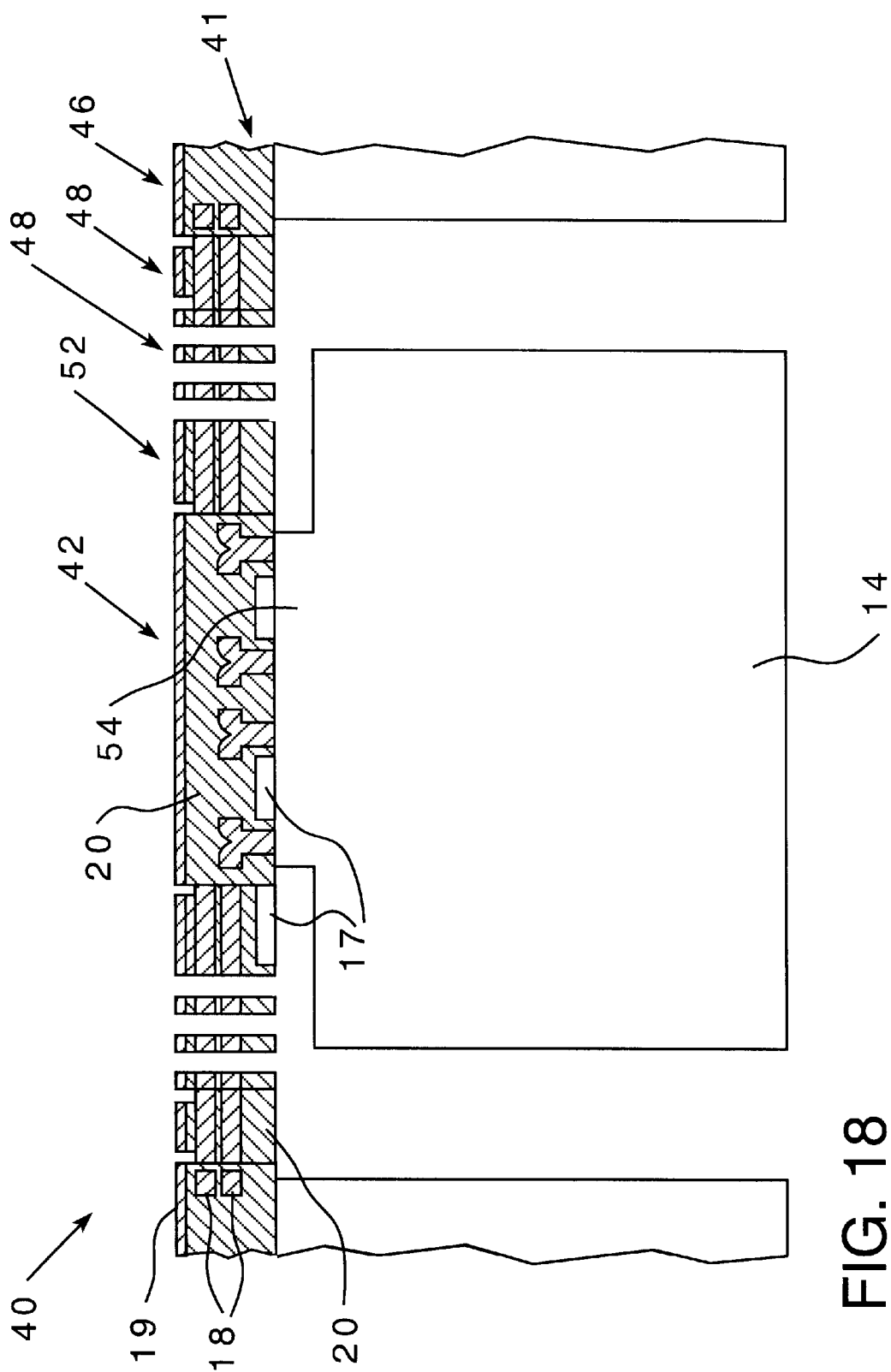
FIG. 18 is a cross-sectional side-view of the microelectromechanical device of FIG. 15 along the A–A' line after isotropically etching the substrate.
Figure 21:
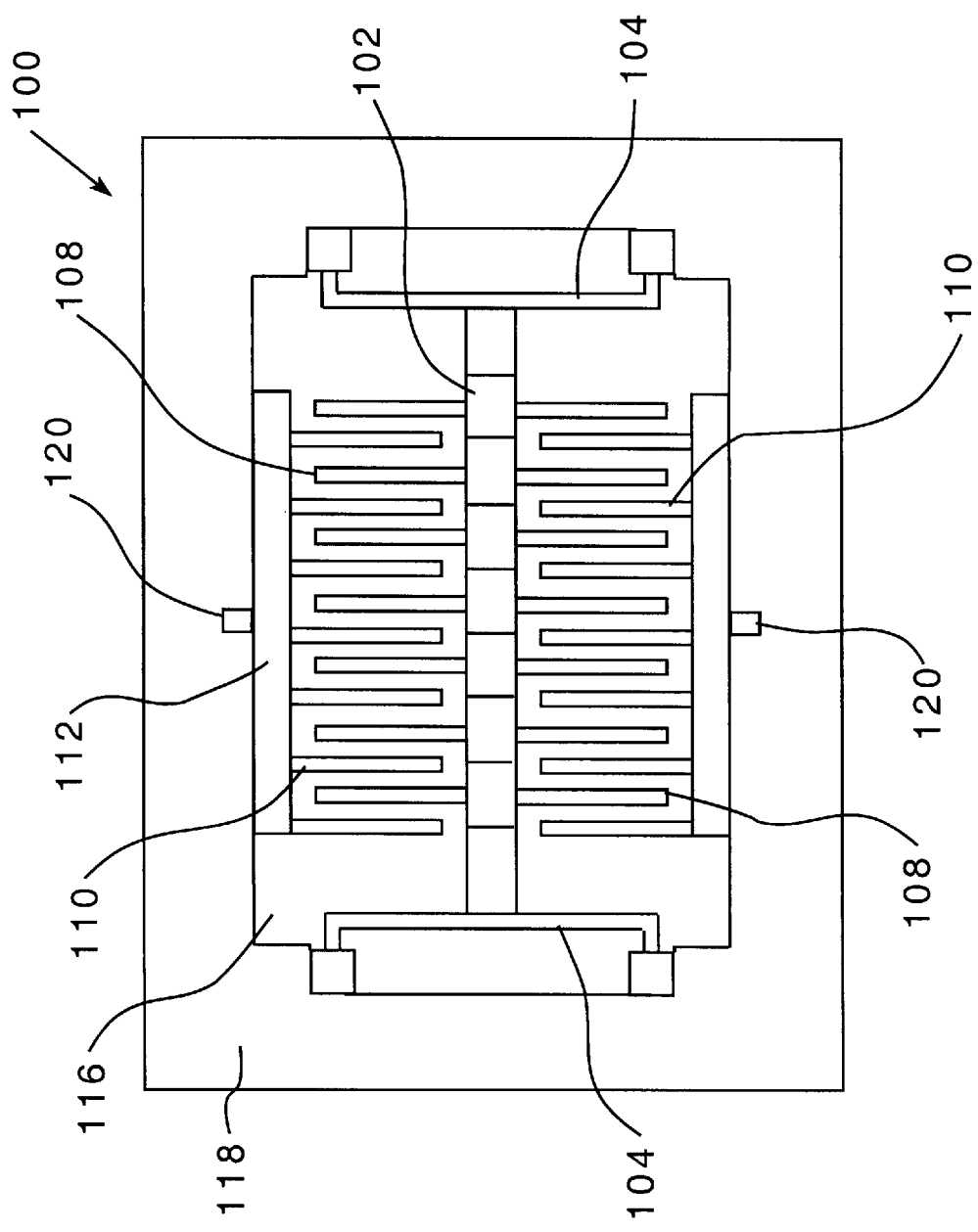
FIG. 21 is a top plan view of a typical prior micromachined accelerometer.

The methods of the present invention may be used, for example, to fabricate micromachined inertial measurement devices and sensors such as, for example, accelerometers and gyroscopes. FIG. 15 is a top view of a micromachined device 40 according to one embodiment of the present invention, and FIGS. 16–18 are cross-sectional side-views of the micromachined device 40 along line A–A' of FIG. 15 at various stages in the fabrication progression of the device 40. The device 40 includes a micromachined structure layer 41 fabricated on a substrate 14, such as a bulk silicon mass substrate. The micromachined structure layer 41 may include a circuitry region 42, springs 44, support beams 46, support frames 48, an anchor frame 50, and sensing elements 52, 53. The micromachined structure layer 41 may be fabricated using conventional CMOS micromachining techniques, and may include polysilicon layers 17, metallization layers 18, including upper metallization layer 19, and dielectric layers 20. The circuitry region 42 may include, for example, CMOS circuitry fabricated according to conventional CMOS fabrication techniques.

FIG. 16 illustrates the device 40 after the structure layer 41 has been etched to define the support beams 46, support frames 48, and sensing elements 52. For an embodiment in which these structures have been fabricated using CMOS micromachining, the structures include dielectric/metallization layers. The dielectric layers 20 of the micromachined structure layer 41 exposed by the upper metallization layers 19 are etched by, for example, a RIE or a DRIE, terminating at the upper surface of the substrate 14, as described hereinbefore.

FIG. 17 illustrates the device 40 after directional etching of the substrate 14. A DRIE is used to etch the substrate 14, using the upper metallization layer 19 as the etching mask. As described hereinbefore, using a DRIE permits the realization of extremely well-defined sidewalls and faster etch rates. Due to the inherent properties of the described DRIE process, however, it cannot etch through the substrate 14 easily where the etching window is small, such as 20 $\mu$m or less. Accordingly, only shallow trenches can be etched in the substrate 14 where the etching window is small. According to the illustrated embodiment, therefore, shallow trenches can only be etched between the support frames 48 and the sensing elements 52, 53. Therefore, after the DRIE, the support frames 48 and the sensing elements 52, 53 are anchored to the substrate 14.

FIG. 18 illustrates the device 40 after isotropic etching of the substrate 14. The isotropic etching may be time controlled to release certain of the structures of the micromachined structure layer 41 from the substrate 14, such as the sensing elements 52, 53 and the support frames 48, while allowing the CMOS circuitry region 42 to be attached to the substrate 14. The isotropic etch may be performed using, for example, sulfur hexafluoride ($SF_6$) or xenon difluoride ($XeF_2$) as the etchant gases.

According to one embodiment of the present invention, the micromachined device 40 is a micromachined accelerometer. The sensing elements 52, 53 include metal layers 18, 19, such that adjacent sensing element pairs form parallel-plate capacitors. The sensing elements 53 are connected to the support frames 46, and the sensing elements 52 are connected to the CMOS circuitry layer 42. The CMOS circuitry layer 42 is attached to the substrate 14, and the portion of the substrate 14 attached to the CMOS circuitry layer 42 acts as the proof mass 54 for the accelerometer 40. In operation, when the accelerometer 40 is accelerated in either direction along the x axis, as indicated in FIG. 15, the bulk mass on which the CMOS circuitry 42 is fabricated, i.e., the proof mass 54 and the sensing elements 52 connected thereto, tend to remain motionless relative to the other components of the accelerometer 40, including the sensing elements 53. Thus, the distance, and therefore the capacitance, between the sensing elements 52, 53 varies. The CMOS circuitry 42 fabricated on the bulk substrate mass may, for example, determine the variable capacitance between the sensing elements 52, 53. Because the sensing elements 52 are supported by and connected to the proof mass 54 on which the CMOS circuitry 42 is fabricated, a negligible amount of parasitic capacitance is introduced in the electrical system of the device 40, thus enhancing device performance. The CMOS circuitry 42 may be externally connected through the metallization layers of the springs 44. The present invention thus leverages that etch lag caused by etching small windows in the etching surface to release the microstructures, such as the sensing elements 52, 53, and yet provides a large bulk proof mass for greater sensitivity. In addition, the device 40 of the present invention provides the advantage that it may be fabricated using maskless, single-sided processing.

FIGS. 19 and 20 illustrate another method for fabricating the micromachined device 40 according to the present invention. FIG. 19 illustrates the device 40 after the structure layer 41 has been etched to define the support beams 46, support frames 48, and sensing elements 52, as discussed hereinbefore with respect to FIG. 16. FIG. 20 illustrates the device 40 after portions of the substrate 14 have been removed according to a tapered etch, using the upper metallization layer 19 as a mask. A tapered etch may be achieved by adjusting parameters of a DRIE, such as the gas flow rate, pressure, and power. A tapered etch produces tapered sidewalls, rather than vertical sidewalls. Accordingly, for one embodiment of the present invention, because the distance between the support frames 48 is narrow, as the substrate 14 is being etched, the tapered sidewalls on both sides of the support frames 48 will meet, producing substrate regions 60, having approximately triangular cross-sectional areas of substrate material underneath the support frames 48. After etching of the substrate 14, the substrate regions 60 may be separated from the other portions of the substrate 14, thereby releasing the support frames 48. Utilizing a tapered etch to etch the substrate 14 therefore reduces the number of processing steps to fabricate the micromachined device 40 because only one etching step is required, in comparison to the two etching steps required for the processing method described hereinbefore with respect to FIGS. 16–18. In addition, the substrate regions 60 underneath the support frames 48 and the sensing elements 52 may compensate for the residual stress in the CMOS interconnect layers, so the structure will tend to be more planar than without the silicon regions 60 underneath the CMOS interconnect layers, thereby enhancing reliability of the structure and consequently overall system performance.

In addition to inertial devices, the method of the present invention may be utilized to fabricate devices for microfluidic applications. Microfluidic applications involve the flow, mixing, reacting, and detection of fluids, typically in an on-chip system. Applications include DNA analysis, chemical synthesis, biochemical drug discovery, drug delivery systems, ink jets, and acoustic sensors and speakers. The methods of the present invention may be used to fabricate microfluidic chambers and channels in the substrate of a microfluidic device having a CMOS circuitry layer. For example, the method of the present invention may be used to create orifices for droplet ejection, channels for liquid flow, and sealed chambers for acoustic or ultrasonic sensors and speakers. Microfluidic devices fabricated according to the methods of the present invention therefore benefit from the processing advantages of the present invention as well as the easy integration of the structures with CMOS circuits and photodiode detectors.

Those of ordinary skill in the art will recognize that many modifications and variations of the present invention may be implemented. The foregoing description and the following claims are intended to cover all such modifications and variations. Furthermore, the materials and processes disclosed are illustrative, but are not exhaustive. Other materials and processes may also be used to make devices embodying the present invention. In addition, the described sequences of processing may also be varied.

What is claimed is:

1. A method for fabricating a micromachined structure, comprising:
    forming a circuitry layer having an upper etch-resistant layer on an upper surface of a substrate;
    directionally etching a portion of the circuitry layer exposed by the upper etch-resistant layer to define first and second circuit microstructures;
    directionally etching a portion the substrate exposed by the upper etch-resistant layer with a deep reactive ion etch; and
    isotropically etching the substrate for a controlled period of time to completely remove substrate material from under the first circuit microstructure such that the substrate material under the second circuit microstructure is electrically isolated from any other substrate material.

2. The method of claim 1, wherein forming the circuitry layer includes forming the circuitry layer on a bulk silicon mass substrate.

3. The method of claim 1, wherein directionally etching the circuitry layer includes directionally etching the portion of the circuitry layer using a reactive ion etch.

4. The method of claim 1, wherein directionally etching the circuitry layer includes directionally etching the portion of the circuitry layer using a deep reactive ion etch.

5. The method of claim 1, wherein:
    forming the circuitry layer includes forming a CMOS circuitry layer having an upper metallization layer;
    directionally etching the portion of the circuitry layer includes directionally etching a portion of the CMOS circuitry layer exposed by the upper metallization layer; and
    directionally etching the portion of the substrate includes directionally etching the portion of the substrate exposed by the upper metallization layer.

6. The method of claim 1, wherein directionally etching the portion of the substrate includes directionally etching the portion of the substrate exposed by the upper etch-resistant layer from the upper surface of the substrate to a lower surface of the substrate.

7. The method of claim 1, wherein directionally etching the portion of the substrate includes directionally etching the portion of the substrate exposed by the upper etch-resistant layer from the upper surface of the substrate to a point in the substrate.

8. The method of claim 7, further comprising back etching the substrate from a lower surface of the substrate to the point.

9. The method of claim 7, wherein etching the portion of the substrate exposed by the upper etch-resistant layer from the upper surface of the substrate to a point in the substrate includes etching the portion of the substrate from the upper surface to an insulating layer in the substrate.

10. The method of claim 9, further comprising etching a portion of the insulating layer.

11. A method for fabricating a micromachined structure, comprising:
    forming a circuitry layer having an upper etch-resistant layer on an upper surface of a substrate;
    directionally etching a portion of the circuitry layer exposed by the upper etch-resistant layer;
    directionally etching a portion of the substrate exposed by the upper etch-resistant layer from the upper surface of the substrate to a point in the substrate; and
    back etching the substrate from a lower surface of the substrate to the point.

12. A method for fabricating a micromachined structure, comprising:
    forming a circuitry layer having an upper etch-resistant layer on an upper surface of a substrate;
    directionally etching a portion of the circuitry layer exposed by the upper etch-resistant layer; and
    directionally etching a portion of the substrate exposed by the upper etch-resistant layer from the upper surface of the substrate to an insulating layer in the substrate.

13. The method of claim 12, further comprising etching a portion of the insulating layer.

14. A method for fabricating a micromachined structure, comprising:

forming a CMOS circuitry layer on an upper surface of a substrate, the CMOS circuitry layer having a dielectric layer and an upper metallization layer; and directionally etching a portion of the dielectric layer from an upper surface of the CMOS circuitry layer to a polysilicon region layer of the CMOS circuitry layer with a deep reactive ion etch.

15. The method of claim 14, further comprising etching the polysilicon region layer.

16. A method of fabricating a microelectromechanical device, comprising:

forming a micromachined structure layer on an upper surface of a substrate, wherein the micromachined structure layer includes an upper etch-resistant layer; and etching a portion of the substrate exposed by the upper etch-resistant layer with a tapered etch.

17. A method for fabricating a micromachined structure, comprising:

forming a circuitry layer having an upper etch-resistant layer on an upper surface of a substrate;

directionally etching a protion of the circuitry layer exposed by the upper etch-resistant layer to define first and second circuit microstructures;

directionally etching a portion the substance exposed by the upper etch-resistant layer from the upper surface of the of the substrate to a lower surface of the substrate with a deep reactive ion etch; and isotropically etchig the substrate for a controlled period of time to completely remove substrate material from under the first circuit microstructure.

* * * * *

UNITED STATES PATENT AND TRADEMARK OFFICE
CERTIFICATE OF CORRECTION

PATENT NO. : 6,458,615 B1
DATED : October 1, 2002
INVENTOR(S) : Gary K. Fedder and Xu Zhu It is certified that error appears in the above-identified patent and that said Letters Patent is hereby corrected as shown below:

Column 12,
Line 7, delete "protion" and substitute therefore with -- portion --
Line 10, delete "substance" and substitute therefore with -- substrate --
Line 15, delete "etchig" and substitute therefore with -- etching --

Signed and Sealed this

Nineteenth Day of August, 2003

JAMES E. ROGAN
*Director of the United States Patent and Trademark Office*